US011442492B2

(12) United States Patent
Abdelmoneum et al.

(10) Patent No.: US 11,442,492 B2
(45) Date of Patent: Sep. 13, 2022

(54) CLOCK GLITCH MITIGATION APPARATUS AND METHOD

(71) Applicant: Intel Corporation, Santa Clara, CA (US)

(72) Inventors: Mohamed A. Abdelmoneum, Portland, OR (US); Nasser A. Kurd, Portland, OR (US); Thripthi Hegde, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 16/292,204

(22) Filed: Mar. 4, 2019

(65) Prior Publication Data

US 2020/0285267 A1 Sep. 10, 2020

(51) Int. Cl.
*G06F 1/08* (2006.01)
*G06F 1/14* (2006.01)
*G06F 9/44* (2018.01)
*H03H 3/007* (2006.01)
*G06F 9/448* (2018.01)

(52) U.S. Cl.
CPC .................. *G06F 1/08* (2013.01); *G06F 1/14* (2013.01); *G06F 9/4498* (2018.02); *H03H 3/0072* (2013.01)

(58) Field of Classification Search
CPC ............. G06F 1/08; G06F 1/14; G06F 9/4498
See application file for complete search history.

(56) References Cited

U.S. PATENT DOCUMENTS

| | | | | |
|---|---|---|---|---|
| 6,204,694 B1* | 3/2001 | Sunter | ........................ | G06F 1/08 |
| | | | | 326/93 |
| 7,831,873 B1* | 11/2010 | Trimberger | .............. | G01K 7/32 |
| | | | | 714/725 |
| 9,543,965 B1* | 1/2017 | Ding | .......................... | H03L 7/04 |
| 9,698,798 B1* | 7/2017 | Fredenburg | ............. | H03L 7/099 |
| 10,778,451 B2* | 9/2020 | Ramlall | ................ | H04L 9/0866 |

(Continued)

OTHER PUBLICATIONS

Coates, Eric, "Digital Electronics", https://learnabout-electronics.org/Digital/dig43.php, Revision 11.00, Sep. 3, 2017.*

(Continued)

*Primary Examiner* — Jaweed A Abbaszadeh
*Assistant Examiner* — Cheri L Harrington
(74) *Attorney, Agent, or Firm* — Schwabe, Williamson & Wyatt, P.C.

(57) ABSTRACT

An apparatus and method to protect unauthorized change to a reference clock for a processor. The apparatus comprises: a first oscillator to generate a first clock; a second oscillator to generate a second clock; a third oscillator to generate a third clock; a first counter to count frequency of the first clock with respect to a fourth clock; a second counter to count frequency of the second clock with respect to the fourth clock; a third counter to count frequency of the third clock with respect to the fourth clock; and a circuitry to compare frequencies of the first, second, and third clocks with one another. The oscillators can be embedded in an interposer or package. These oscillators include one or more of: LC oscillator, micro electro-mechanical system (MEMs) based resonator, or ring oscillator.

12 Claims, 8 Drawing Sheets

(56) References Cited

U.S. PATENT DOCUMENTS

| | | | | |
|---|---|---|---|---|
| 2007/0250938 | A1* | 10/2007 | Suh | G06F 21/73 726/34 |
| 2008/0136400 | A1* | 6/2008 | Chi | G06F 1/324 323/318 |
| 2008/0146180 | A1* | 6/2008 | Yoda | G06F 1/04 455/208 |
| 2011/0261842 | A1* | 10/2011 | Beili | H04L 7/0083 370/503 |
| 2012/0050086 | A1* | 3/2012 | Ito | H03M 1/60 341/155 |
| 2014/0173324 | A1* | 6/2014 | Dobbs | G06F 11/1604 713/501 |
| 2014/0232434 | A1* | 8/2014 | Koazechi | G06F 1/06 327/40 |
| 2015/0317475 | A1* | 11/2015 | Aguayo Gonzalez | G06F 21/55 726/23 |
| 2016/0013802 | A1 | 1/2016 | Min et al. | |
| 2017/0032125 | A1 | 2/2017 | Lee et al. | |
| 2018/0138859 | A1* | 5/2018 | Shin | H03B 5/364 |
| 2019/0384915 | A1* | 12/2019 | Hars | H04L 9/3236 |
| 2020/0033907 | A1* | 1/2020 | Chossat | H03K 19/21 |
| 2020/0043869 | A1* | 2/2020 | Yanamadala | G01N 27/045 |
| 2020/0209309 | A1* | 7/2020 | Martin | G06F 1/08 |
| 2020/0348715 | A1* | 11/2020 | Merio | H04W 52/029 |

OTHER PUBLICATIONS

Lin, Yu-Wei et al., "Series-Resonant VHF Micromechanical Resonator Reference Oscillators", IEEE Journal of Solid-State Circuits, vol. 39, No. 12, Dec. 2004, 15 pgs.

Nguyen, Clark et al., "MEMS Technology for Timing and Frequency Control", IEEE Transactions on Ultrasonics, Ferroelectrics, and Frequency Control, vol. 54, No. 2, Feb. 2007, 20 pgs.

International Search Report and Written Opinion from PCT/US2020/013756 notified May 12, 2020, 11 pgs.

* cited by examiner

CLOCK GLITCH MITIGATION APPARATUS AND METHOD

BACKGROUND

Clock is provided to a processor via an external crystal oscillator. This clock is then used as a reference clock by a phase locked loop (PLL) of the processor to generate one or more clocks for operating the processor. The physical traces or routings from the external crystal oscillator and the processor (or any intermediary chip) are exposed to potential attackers. For example, modulating the signal on the traces can change the characteristics (e.g., amplitude, frequency, phase, duty cycle, noise profile, etc.) of the clock from the external crystal oscillator. Further, radio frequency interference (RFI) due to coupling of radio frequency (RF) energy to the exposed crystal traces can further compromise the clock from the crystal. Any unauthorized manipulation of the clock from the crystal can negatively impact the functional safety and security of the processor and hence the computing system.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
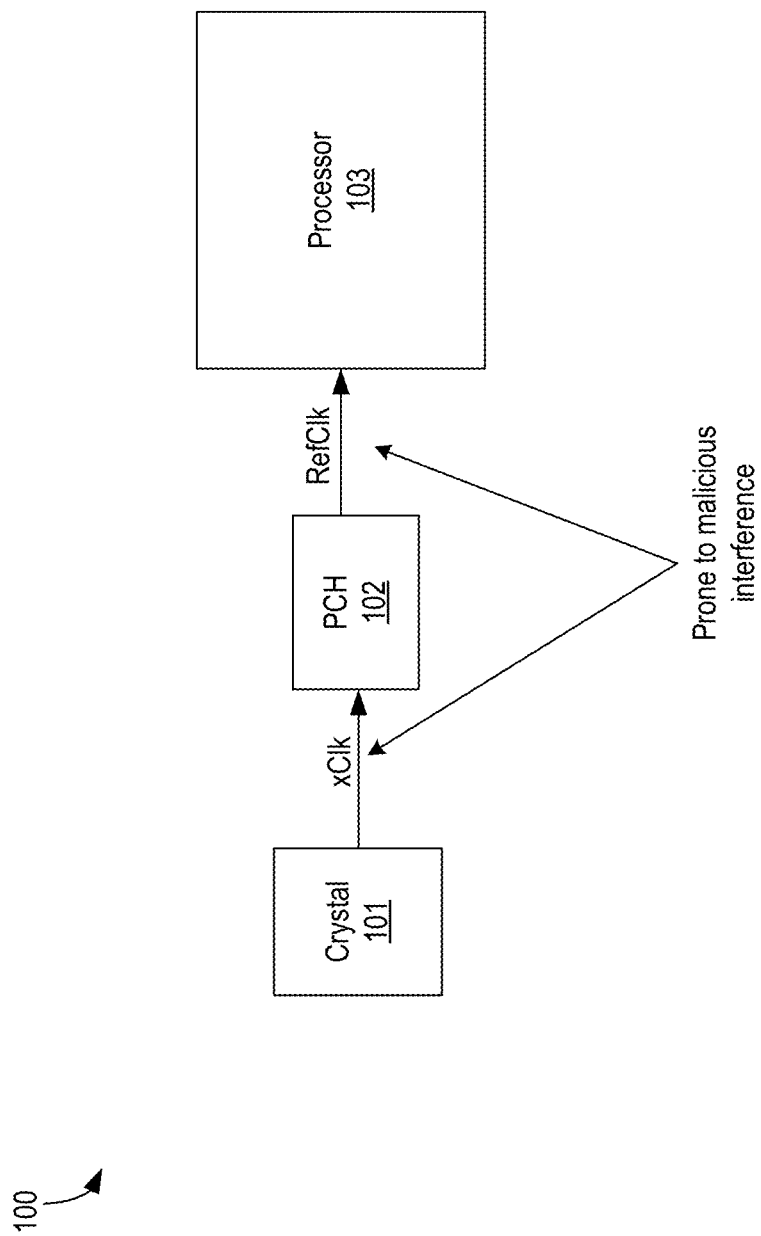
FIG. 1 illustrates a high-level clocking scheme where clock is generated by an external crystal.

Some embodiments disclose an array of integrated and spatially distributed micromechanical resonator oscillators to detect and provide redundancy and fail-safe mechanism against glitch attacks and other unauthorized manipulation to a processor's reference clock. The integration scheme provides radio frequency interference (RFI) resiliency. In some embodiments, an apparatus and method is provided to protect unauthorized change to a reference clock for a processor. The apparatus comprises: a first oscillator to generate a first clock; a second oscillator to generate a second clock; and a third oscillator to generate a third clock. The embodiments are not limited to three oscillators. Any number of oscillators greater than one can be used. In some embodiments, the apparatus comprises a first counter to count frequency of the first clock with respect to a fourth clock; a second counter to count frequency of the second clock with respect to the fourth clock; and a third counter to count frequency of the third clock with respect to the fourth clock. In various embodiments, the apparatus comprises a circuitry to compare frequencies of the first, second, and third clocks with one another. The oscillators can be embedded in an interposer or package. These oscillators include one or more of: LC oscillator, micro electro-mechanical system (MEMs) based resonator, or ring oscillator (RO).

There are many technical effects of various embodiments. For example, the apparatus and scheme of various embodiments eliminates glitch attacks vulnerability and delivers a redundancy mechanism that protects against more sophisticated attacks that use, for instance, Focused Ion Beam (FIB) probing of the package/silicon to gain physical access to the clock traces on the package/chip, the apparatus and scheme of various embodiments provides integration shields against the RFI coupling and increases the RFI resiliency. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a high-level clocking scheme 100 where clock is generated by an external crystal. The clocking scheme 100 comprises crystal 101, platform control hub (PCH) 102, and processor 103. In most computing systems, a reference clock (RefClk) is generated by a device referred to as Crystal 101. Crystal 101 comprises an oscillator, which uses mechanical resonance of piezoelectric material to create an oscillating electrical signal xClk with a precise frequency. xClk may be received directly as RefClk by processor 103, or may be first received by another processor such as platform control hub (PCH) 102. The transmission lines or traces that carry xClk and/or RefClk are sometimes visible on a printed circuit board (PCB) or can be easily accessible through focused ion beam (FIB) approaches. As such, the traces that carry xClk and/or RefClk are vulnerable to glitch attacks, unauthorized modulation, and/or RFI. If RefClk is changed, operating frequency of processor 103 may change. In some cases, an unexpected change in RefClk may cause a phase locked loop (PLL) of processor 103 to lose lock and/or generate unexpected output clock frequency. As such, attacks on xClk or RefClk can cause functional safety issues, processor security risk, and/or compromise of intellectual property of processor 103 or programs executing on it.

In some platforms, crystal 101 is connected to an external chip like CK505 from IDT™ (Integrated Device Technology) which has the oscillator circuit and the output from the CK505 is the reference clock that goes to the SoC/PCH 102 or 103. In other platforms, the oscillator circuit is inside PCH or SoC 102 and crystal 101 is on the board and is connected to the inputs of the oscillator circuit. The output of this on-chip oscillator is routed on silicon to the first PLL (phase locked loop) to generate a higher frequency clock that drives subsequent PLL's either on silicon and/or through package traces to another on package silicon chip (CPU).

Figure 2:
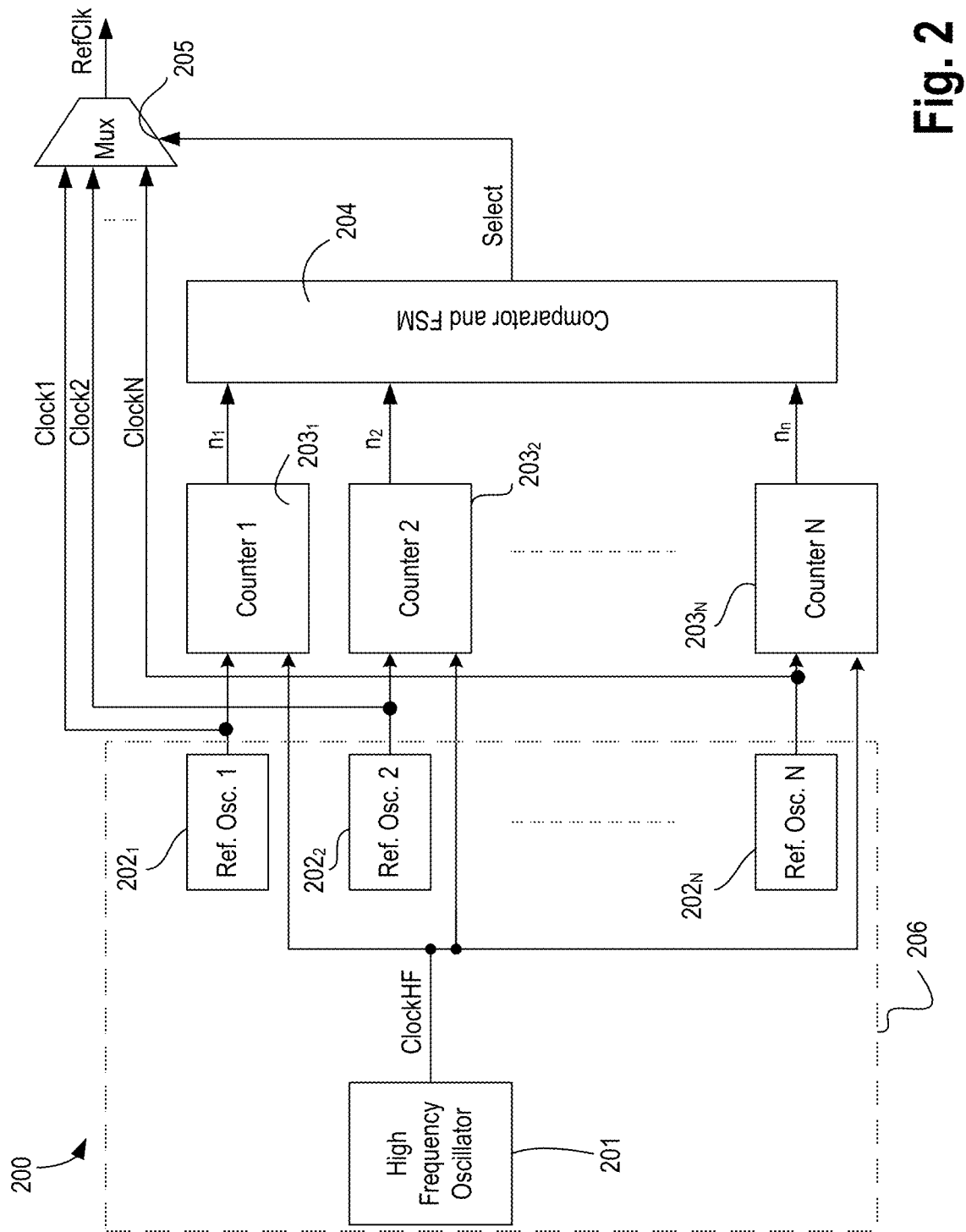
FIG. 2 illustrates a functionally safe clocking architecture with glitch mitigation, in accordance with some embodiments.

FIG. 2 illustrates a functionally safe clocking architecture 200 with glitch mitigation, in accordance with some embodiments. Architecture 200 comprises a high-frequency oscillator 201, a plurality of reference (Ref.) oscillators (Osc.) $202_{1-N}$, where is an integer; a plurality of counters $203_{1-N}$; comparator logic and finite state machine (FSM) 204, and multiplexer 205 coupled together as shown. High-frequency oscillator 201 can be any suitable oscillator 201 that generates ClockHF. For example, high-frequency oscillator 201 can be implemented as an inductor-oscillator (LC) oscillator, micro electrical mechanical system (MEMS) based resonator; and ring oscillator with precise output frequency. ClockHF is used by counters $203_{1-N}$ as a clock signal to count the frequency of Clock1 through ClockN, which are outputs of reference oscillators $202_{1-N}$, respectively. Oscillators $202_{1-N}$ can be implemented as LC oscillator, MEMS based resonator; and ring oscillator with precise output frequency. The frequency of Clock1 through ClockN is much lower than the frequency of ClockHF. The outputs $n_{1-N}$ of each counter $203_{1-N}$ is compared with each other by logic 204 to determine any change in frequency of Clock1-N relative to one another. Here, N is an integer greater than 1. In an ideal situation (e.g., in the absence of any attack or compromise of Clock1-N), frequencies of Clock1-N will be the same.

Utilizing multiple integrated and spatially distributed micromechanical resonators 201 and $202_{1-N}$ acting as the tank elements for the oscillators, multiple sources of RefClk are provided, in accordance with some embodiments. In some embodiments, the micromechanical resonators are integrated in package or on interposer, or in silicon to generate multiple identical reference clocks (RefClks) compared to computing platforms that rely on a single external single oscillator to generate the reference clock as shown in FIG. 1. Referring back to FIG. 2, the frequency of each of the integrated spatially distributed oscillator (e.g., outputs Clock1 through ClockN) is counted via an on-package or on-chip high-frequency oscillator 201, and the frequency of each of the individual reference oscillators $202_{1-N}$ in the array is compared against each other by logic 204 to ensure frequency fidelity.

In some embodiments, logic 204 provides a select signal (or multi-bit code) for multiplexer (Mux) 205 to select one of the clocks Clock1-N as Refclk. For example, logic 204 determines that Clock 2 is compromised because its frequency is not the same as the frequency of other clocks, in that case logic 204 selects Clock 1 as RefClk so that processor 103 can continue to operate with an uncompromised clock as reference clock.

Figure 3:
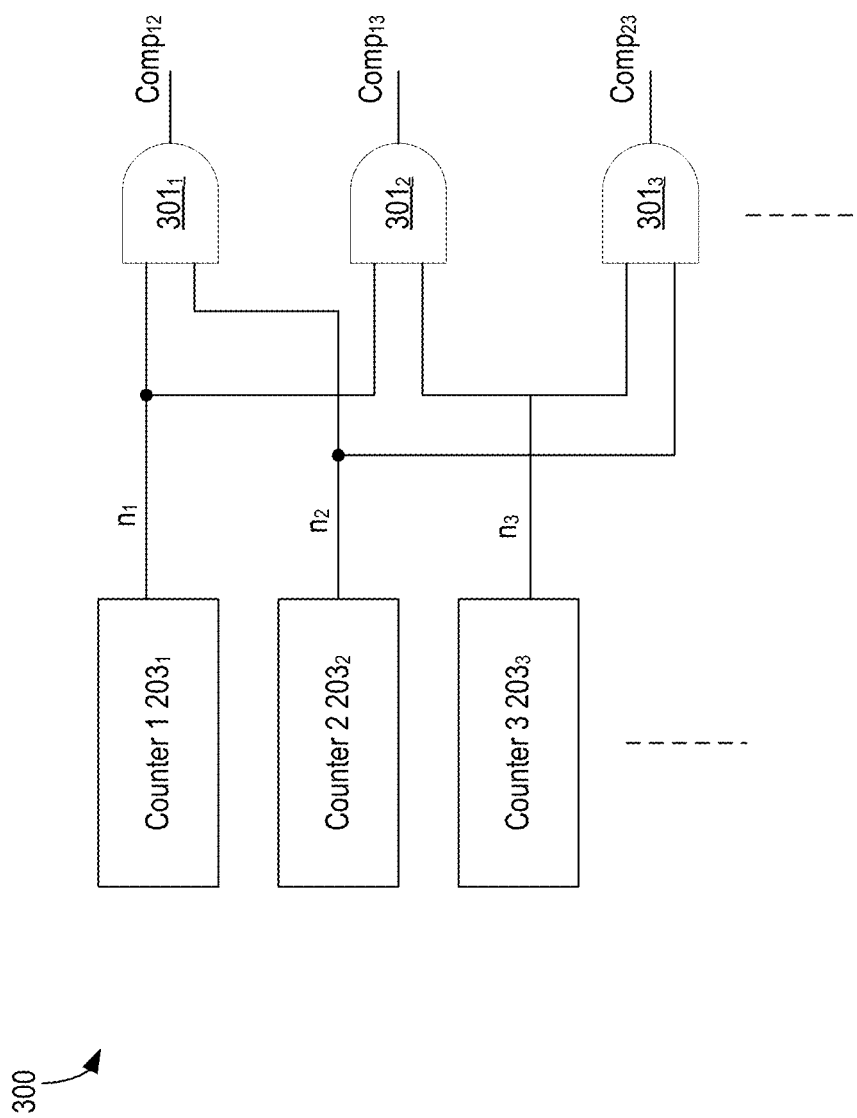
FIG. 3 illustrates a spatially distributed set of reference oscillators with frequency comparators to identify glitches among the different oscillators, in accordance with some embodiments.

FIG. 3 illustrates apparatus 300 comprising spatially distributed set of reference oscillators with frequency comparators to identify glitches among the different oscillators, in accordance with some embodiments. Apparatus 300 illustrate a portion of logic 204. Here, AND logic gates $301_{1-N}$ are shown that compare outputs of counters $203_{1-N}$. While FIG. 3 illustrates three counters and three AND gates, any number of counter and AND gates can be used for cross-comparison. A person skilled in the art would appreciate that AND gates can be replaced with comparable logic gates to achieve the same function. In this example, AND gate $301_1$ compares counter output $n_1$ with $n_2$, and generates a comparison result $Comp_{12}$, AND gate $301_2$ compares counter output $n_1$ with $n_3$, and generates a comparison result $Comp_{13}$, and AND gate $301_3$ compares counter output $n_2$ with $n_3$, and generates a comparison result $Comp_{23}$. These outputs of AND logic gates are then analyzed by an FSM (not shown) to determine which clock from among Clock1 through ClockN to select as RefClk.

Frequency comparators detect any discrepancy in frequency between any two pairs of oscillators. If a glitch is injected on one oscillator (e.g., $202_1$) it will be detected by the frequency comparators. Upon detection of the glitch, the system can be shut down immediately or the RefClk can be generated from a different glitch free oscillator in the array and the system will shut down gracefully to ensure functional safety. The integration of the oscillators 201 and $202_{1-N}$ on a package or an interposer and spatially distributing them ensures that the frequency of all of the reference clock oscillators cannot be simultaneously and equally glitched.

In some embodiments, FSM may further inform processor 103 (or operating system) about any compromised clocks so that processor 103 (or operating system) can decide what functional safety measures to take. For example, processor 103 may decide to turn off itself because anyone of clocks is compromised. In another example, processor 103 may inform a user that the processor is no longer secure. In another example, processor 103 may use one of the uncompromised clocks and continue to operate as normal. Any number of steps can be taken by processor 103 after analyzing the frequencies of $n_1$, $n_2$, $n_3$, etc.

Figure 4:
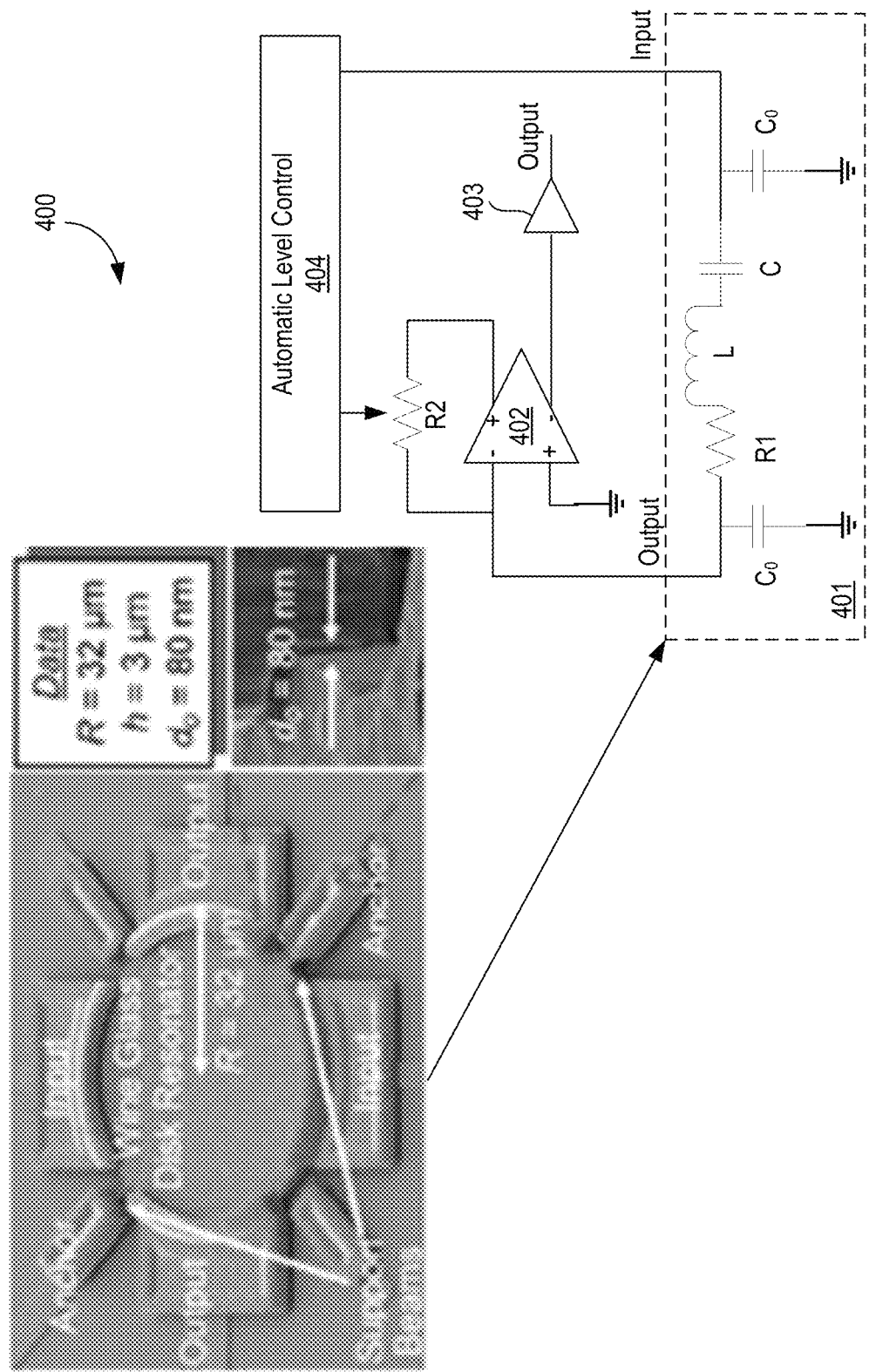
FIG. 4 illustrates an example of one type of high quality-factor micro mechanical resonator for use in the functionally safe clocking architecture with glitch mitigation, in accordance with some embodiments.

FIG. 4 illustrates an example of one type of high quality-factor micro mechanical resonator circuit 400 for use in the functionally safe clocking architecture with glitch mitigation, in accordance with some embodiments. Resonator circuit 400 can be used for any of the oscillators of FIG. 2. In some embodiments, resonator circuit 400 comprises an RLC network (with capacitors C, Co, resistor R1, and inductor L) that models a wine-glass mode resonator. Embodiments are not limited to wine-glass mode resonators and any type of resonator may be used. This resonator can be fabricated inside an interposer or package, or as a separate die. The input of micromechanical portion 401 of resonator circuit 400 is coupled to an automatic level control circuitry 404, with the output of micromechanical portion 401 of resonator circuit 400 is coupled to an input of amplifier 402. One output of amplifier 402 is coupled back to the input of amplifier 402 via resistor R2, while another output of amplifier 402 provides an oscillating output, which is amplified by buffer 403. The automatic level control 404 can adjust the bias level of the signal received by amplifier 402. The output of buffer 403 is then received by a counter.

The counter (e.g., $203_1$) uses the clock from the high frequency oscillator (e.g., 201) to count the frequency of the low frequency oscillator (e.g., $202_1$). A plurality of these low frequency oscillators (e.g., $202_{1-N}$) are spatially distributed on package/interposer/die and the output counts (e.g., $n_1$ though $n_N$) from the counters for each of these low frequency oscillators are cross compared against each other to identify any drift in frequency of the low frequency oscillators. A state machine (e.g., 204) analyzes the output of these cross-comparators and detects differences in the frequencies more than a preprogramed (or programmable) threshold. The state machine (e.g., 204) then selects the most stable low frequency oscillator to deliver the reference clock RefClk while flagging a malicious behavior if the threshold is exceeded by one of the oscillators triggering a safe fail mechanism.

The micro mechanical resonator circuit 400 of FIG. 4 is a capacitive micromechanical resonator but can be a piezoelectric resonator, a hybrid capacitive-piezoelectric resonator or a piezoelectric on capacitive resonator.

Figure 5:
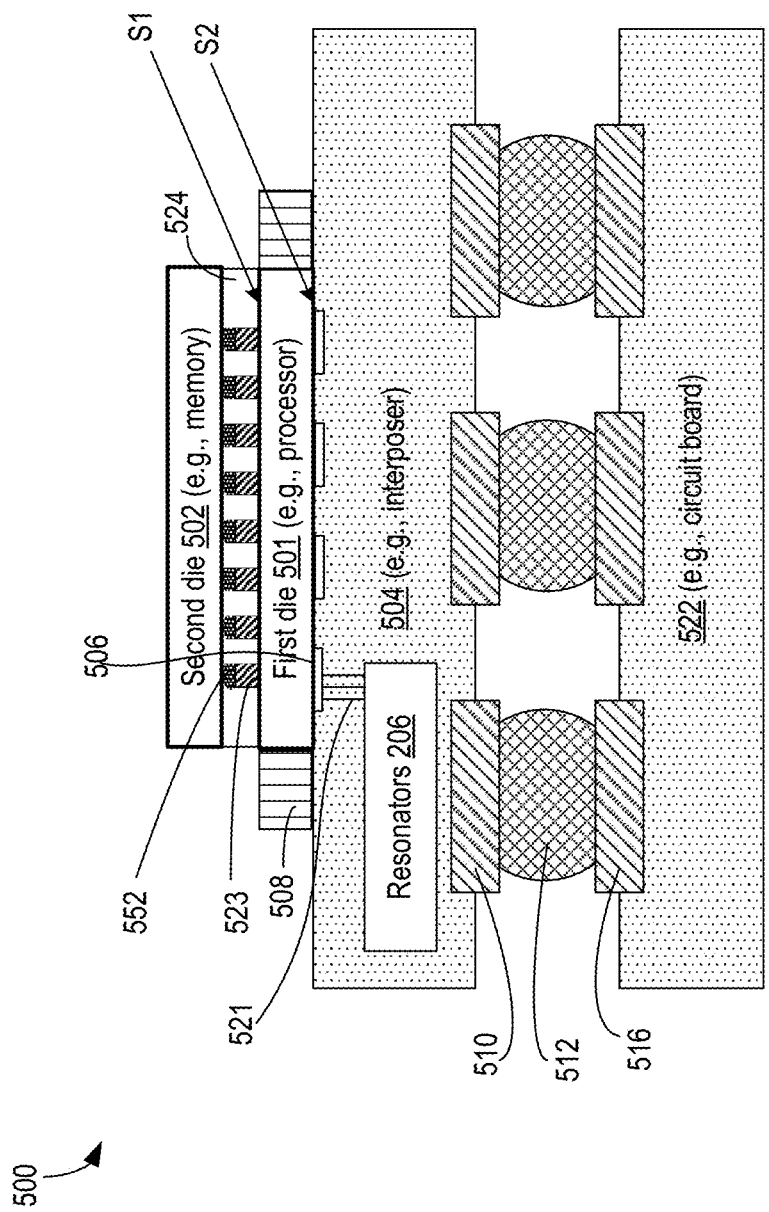
FIG. 5 illustrates a cross-section of a package with embedded resonators or oscillators to provide a reference clock, in accordance with some embodiments.

FIG. 5 illustrates cross-section 500 of a package with embedded resonators or oscillators to provide a reference clock, in accordance with some embodiments. In some embodiments, cross-sectional view 500 is of an integrated circuit (IC) package assembly, in accordance with various embodiments. In some embodiments, IC package assembly may include First die 501 (e.g., processor 103), package substrate 504, and circuit board 522. IC package assembly of cross-sectional view 500 is one example of a stacked die configuration in which First die 501 is coupled to package substrate 504, and Second die 502 (e.g., memory) is coupled with. First die 501, in accordance with some embodiments. In some embodiments, resonator die 206 comprising resonators 201 and $202_{1-N}$ are embedded in substrate or interposer. The clocks from resonator die 206 are then provided to processor 501 though traces 521, where one of the clocks is selected as a reference clock (RefClk).

In some embodiments, First die 501 may have a first side S1 and a second side S2 opposite to the first side S1. In some embodiments, first side S1 may be the side of the die commonly referred to as the "inactive" or "back" side of the die. In some embodiments, second side S2 may include one or more transistors, and may be the side of the die commonly referred to as the "active" or "front" side of the die. In some embodiments, Second side S2 of First die 501 may include one or more electrical routing features 506. In some embodiments, Second die 502 may include an "active" or "front" side with one or more electrical routing features 506. In some embodiments, electrical routing features 506 may be bond pads.

In some embodiments, Second die 502 may be coupled to First die 501 in a front-to-back configuration (e.g., the "front" or "active" side of Second die 502 is coupled to the "back" or "inactive" side S1 of First die 501). In some embodiments, dies may be coupled with one another in a front-to-front, back-to-back, or side-to-side arrangement. In some embodiments, one or more additional dies may be coupled with First die 501, Second die 502, and/or with package substrate 504. Other embodiments may lack Second die 502. In some embodiments, First die 501 may include one or more through-silicon vias (TSVs).

In some embodiments, Second die 502 is coupled to First die 501 by die interconnects. In some embodiments, inter-die interconnects may be solder bumps, copper pillars, or other electrically conductive features. In some embodiments, an interface layer 524 may be provided between First die 501 and Second die 502. First die 501 may couple to second die 502 using TSVs. In some embodiments, interconnect pillars 523 with corresponding solder balls 552 are used to connect First die 501 with second die 502. In some embodiments, interface layer 524 may be, or may include, a layer of under-fill, adhesive, dielectric, or other material. In some embodiments, interface layer 524 may serve various functions, such as providing mechanical strength, conductivity, heat dissipation, or adhesion.

In some embodiments, First die 501 and Second die 502 may be single dies. In other embodiments, First die 501 and/or Second die 502 may include two or more dies. For example, in some embodiments First die 501 and/or Second die 502 may be a wafer (or portion of a wager) having two or more dies formed on it. In some embodiments, First die 501 and/or Second die 502 includes two or more dies embedded in an encapsulant. In some embodiments, the two or more dies are arranged side-by-side, vertically stacked, or positioned in any other suitable arrangement. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, First die 501 and/or Second die 502 may be a primary logic die. In some embodiments, First die 501 and/or Second die 502 may be configured to function as memory, an application specific circuit (ASIC), a processor, or some combination of such functions. For example, First die 501 may include a processor and Second die 502 may include memory. In some embodiments, one or both of First die 501 and Second die 502 may be embedded in encapsulant 508. In some embodiments, encapsulant 508 can be any suitable material, such as epoxy-based build-up substrate, other dielectric/organic materials, resins, epoxies, polymer adhesives, silicones, acrylics, polyimides, cyanate esters, thermoplastics, and/or thermosets.

In some embodiments, First die 501 may be coupled to package substrate 504. In some embodiments, package substrate 504 may be a coreless substrate. For example, package substrate 504 may be a bumpless build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate, but can be used for any suitable flip chip substrates.

In some embodiments, the one or more build-up layers may have material properties that may be altered and/or optimized for reliability, warpage reduction, etc. In some embodiments, package substrate 504 may be composed of a polymer, ceramic, glass, or semiconductor material. In some embodiments, package substrate 504 may be a conventional cored substrate and/or an interposer.

In some embodiments, circuit board 522 may be a Printed Circuit Board (PCB) composed of an electrically insulative material such as an epoxy laminate. For example, circuit board 522 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material.

Structures such as traces, trenches, and vias (which are not shown here) may be formed through the electrically insulating layers to route the electrical signals of First die 501 through the circuit board 522. Circuit board 522 may be composed of other suitable materials in other embodiments.

In some embodiments, circuit board 522 may include other electrical devices coupled to the circuit board that are configured to route electrical signals to or from First die 501 through circuit board 522. In some embodiments, circuit board 522 may be a motherboard.

In some embodiments, a first side of package substrate 504 is coupled to second surface S2 and/or electrical routing features 506 of First die 501. In some embodiments, a second opposite side of package substrate 504 is coupled to circuit board 522 by package interconnects 512. In some embodiments, package interconnects 512 may couple electrical routing features 510 disposed on the second side of package substrate 504 to corresponding electrical routing features 516 on circuit board 522.

In some embodiments, package substrate 504 may have electrical routing features formed therein to route electrical signals between First die 501 (and/or the Second die 502) and circuit board 522 and/or other electrical components external to the IC package assembly. In some embodiments, package interconnects 512 and die interconnects 506 include any of a wide variety of suitable structures and/or materials including, for example, bumps, pillars or balls formed using metals, alloys, solderable material, or their combinations. In some embodiments, electrical routing features 510 may be arranged in a ball grid array ("BGA") or other configuration.

Figure 6:
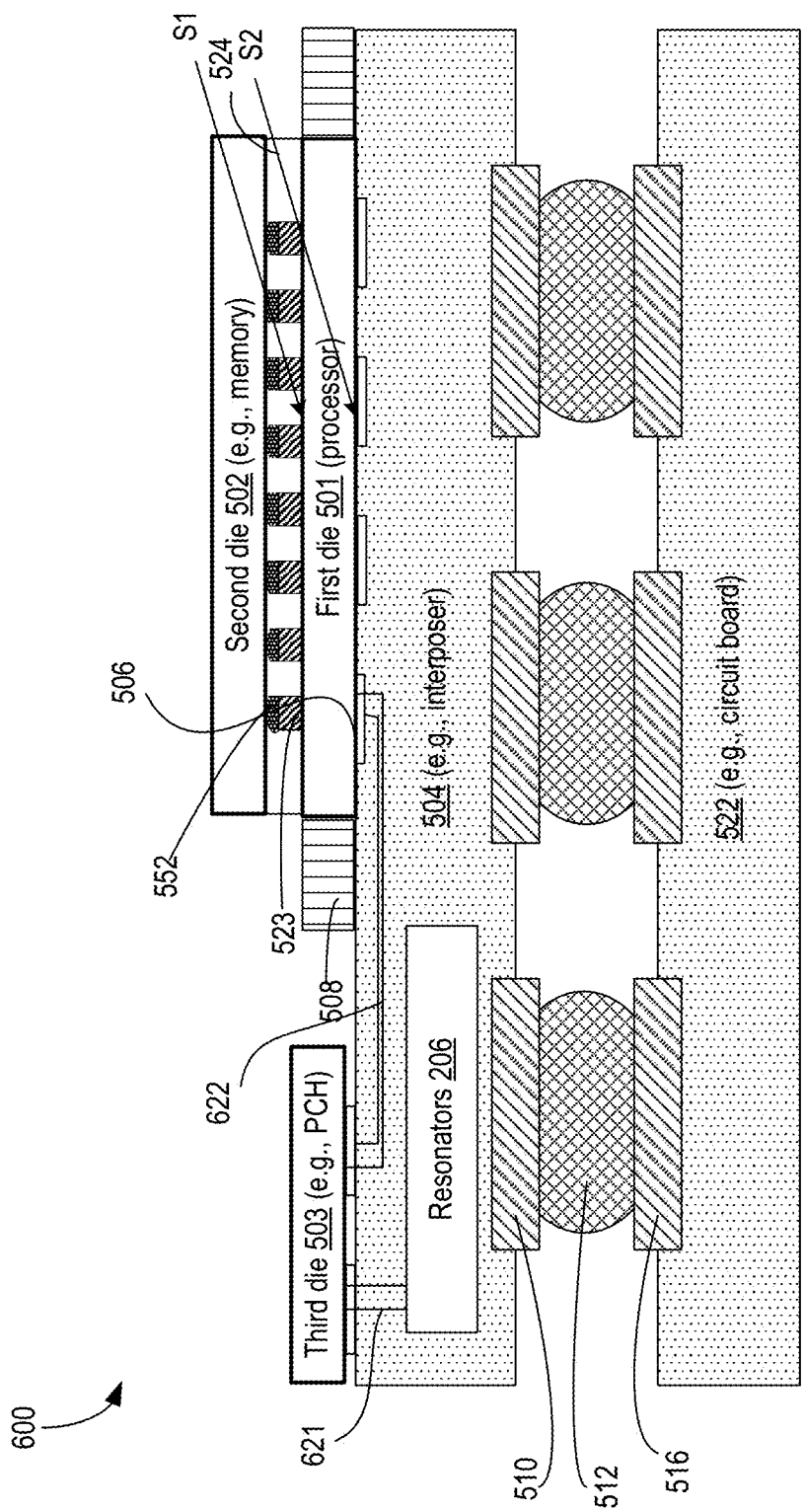
FIG. 6 illustrates a cross-section of a package with embedded resonators or oscillators to provide a reference clock, in accordance with some embodiments.

FIG. 6 illustrates cross-section 600 of a package with embedded resonators or oscillators to provide a reference clock, in accordance with some embodiments. Cross-section 600 is similar to cross-section 500 but for an additional die 503 (Third Die) which includes the comparators and FSM 204 and Mux 205. Clocks from resonator die 206 are provided to Third Die 503 via traces 621. A selected clock is then provided by PCH to processor 501 via traces 622.

Figure 7:
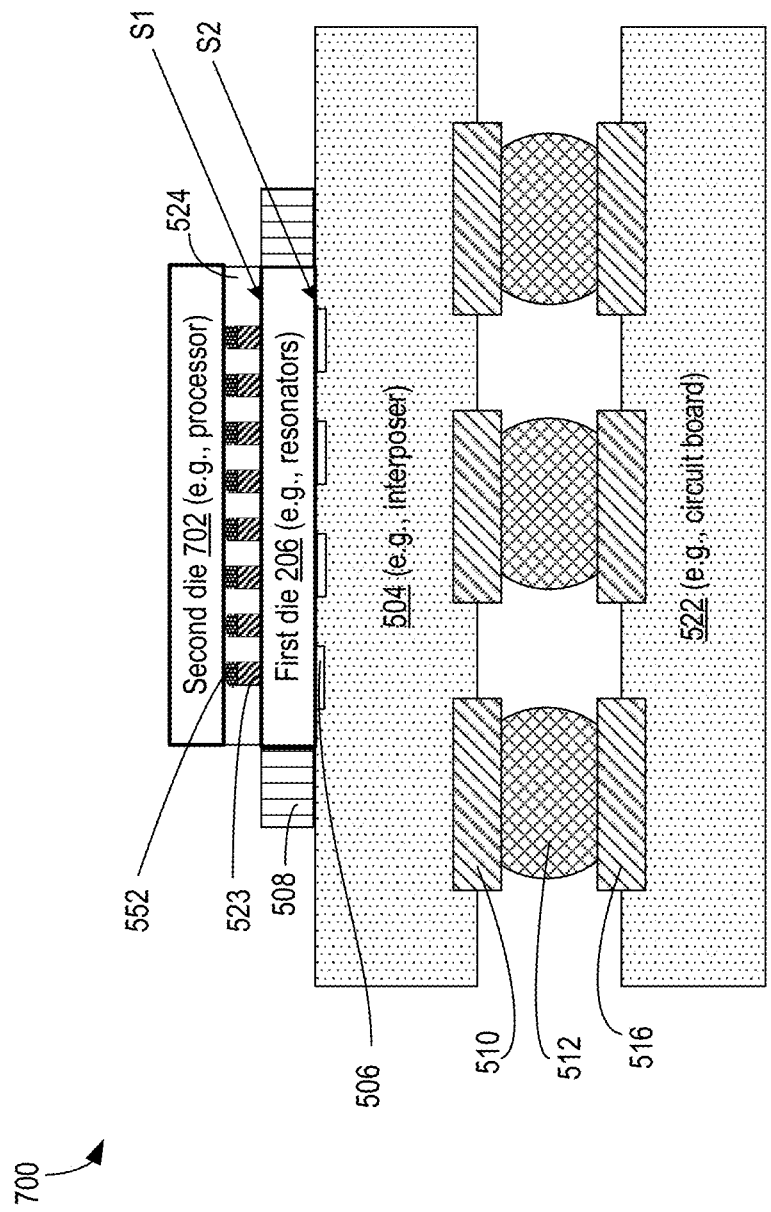
FIG. 7 illustrates a cross-section of a package with stacked embedded resonators or oscillators to provide a reference clock, in accordance with some embodiments.

FIG. 7 illustrates cross-section 700 of a package with stacked embedded resonators or oscillators to provide a reference clock, in accordance with some embodiments. Cross-section 700 is similar to cross-section 500 but for the location of resonator die 206. Here, resonator die 206 is the First die below second die 702, where second die is a processor die. In some embodiments, resonator die 206 is above second die 702 such that second die 702 is directly coupled to substrate or interposer 504.

Figure 8:
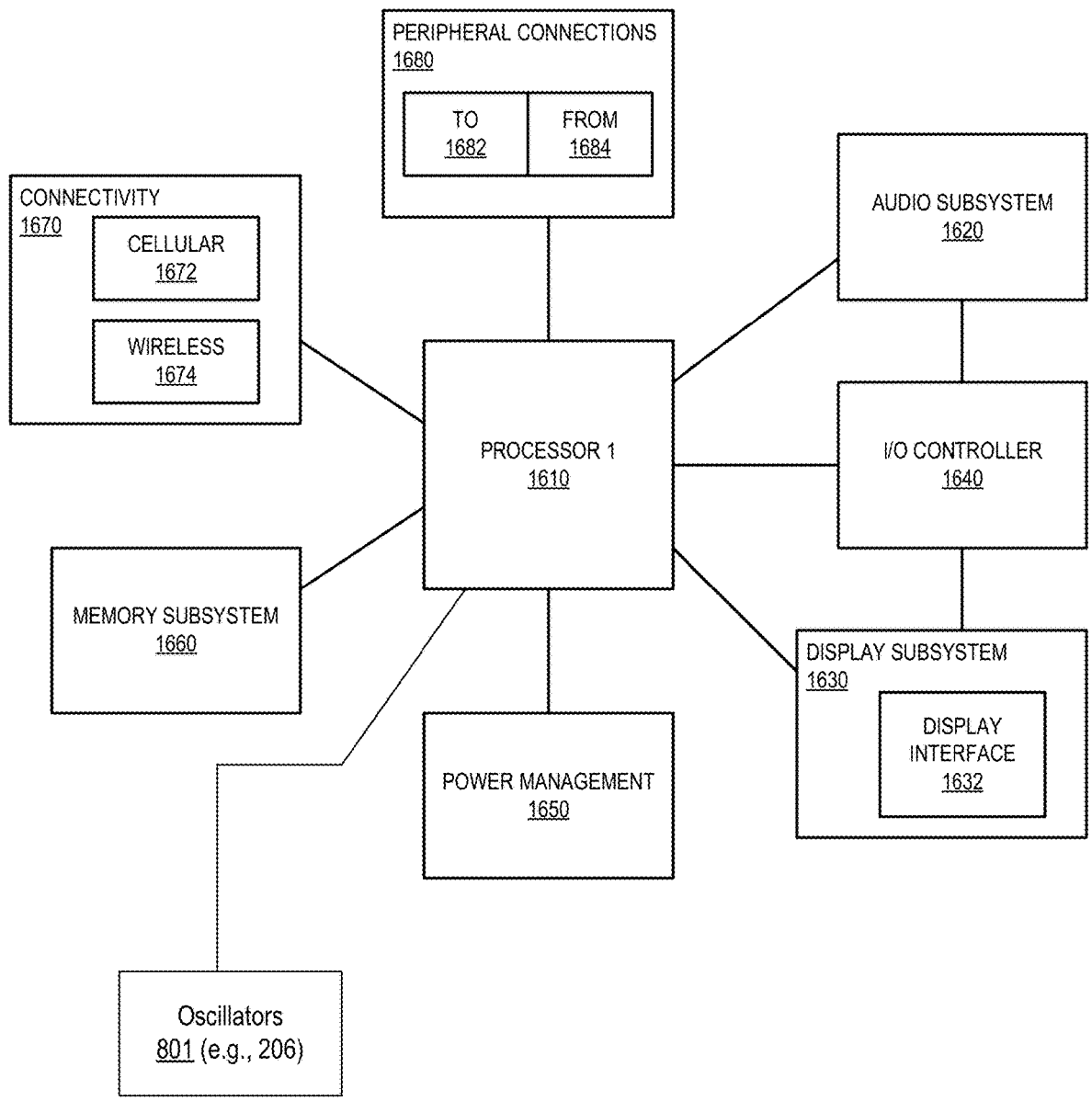
FIG. 8 illustrates a smart device, or a computer system, or a SoC (System-on-Chip) which receives clock from a protected clock source, according to some embodiments of the disclosure.

FIG. 8 illustrates a smart device, or a computer system, or a SoC (System-on-Chip) which receives clock from a protected clock source, according to some embodiments of the disclosure. FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes processor which receives a clock from a safe source, according to some embodiments discussed. Other blocks of the computing device 1600 may also receive a clock from the safe source, according to some embodiments. The various embodiments of the present disclosure may also comprise a network interface within 1670 such as a wireless interface so that a system embodiment may be incorporated into a wireless device, for example, cell phone or personal digital assistant.

In various embodiments, the plurality of resonators or oscillators 802 (e.g., 206) provide a plurality of clocks to processor 1610. A plurality of counters and comparators determine the frequencies of these clocks and identify any unexpected change in the frequencies. Processor 1610 uses one of the clocks as a reference clock. In some embodiments, processor 1610 gracefully shuts down if any of the clocks from oscillators 801 show change in frequency beyond a threshold.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a first oscillator to generate a first clock; a second oscillator to generate a second clock; a third oscillator to generate a third clock; a first counter to count frequency of the first clock with respect to a fourth clock; a second counter to count frequency of the second clock with respect to the fourth clock; a third counter to count frequency of the third clock with respect to the fourth clock; and a circuitry to compare frequencies of the first, second, and third clocks with one another.

Example 2

The apparatus of example 1 comprising a fourth oscillator to generate the fourth clock, wherein frequency of the fourth clock is higher than individual frequencies of the first, second, and third clocks.

Example 3

The apparatus of example 1, wherein the first, second, third, and fourth oscillators are embedded in an interposer or package.

Example 4

The apparatus of example 1, wherein the first, second, third, or fourth oscillators include one of: LC oscillator; MEMS based resonator; or ring oscillator.

Example 5

The apparatus of example 1 comprising a multiplexer to select one of the first, second, or third clocks as an output clock in accordance with an output of the circuitry.

Example 6

The apparatus of example 5, wherein the output clock or a version of the output clock is received by a clock generator as a reference clock.

Example 7

The apparatus of example 1 comprising a finite state machine to analyze the comparison of the frequencies of the first, second, and third clocks with one another, to determine an unauthorized change in the first, second, or third clock frequencies.

Example 8

The apparatus of example 7, wherein the FSM is to instruct an operating system (OS) or a power management circuitry to turn off a processor when the unauthorized change is determined.

Example 9

An apparatus comprising: interposer comprising: a first oscillator to generate a first clock; a second oscillator to generate a second clock; a third oscillator to generate a third clock; and a processor die coupled to the interposer, wherein the processor die includes: a first counter to count frequency of the first clock with respect to a fourth clock; a second counter to count frequency of the second clock with respect to the fourth clock; a third counter to count frequency of the third clock with respect to the fourth clock; and a circuitry to compare frequencies of the first, second, and third clocks with one another.

Example 10

The apparatus of example 9, wherein the interposer comprises a fourth oscillator to generate the fourth clock, wherein frequency of the fourth clock is higher than individual frequencies of the first, second, and third clocks.

Example 11

The apparatus of example 10, wherein the first, second, third, or fourth oscillators include one of: LC oscillator; MEMS based resonator; or ring oscillator.

Example 12

The apparatus of example 10, wherein the processor die comprises a multiplexer to select one of the first, second, or third clocks as an output clock in accordance with an output of the circuitry.

Example 13

The apparatus of example 12, wherein the processor die includes a clock generator, and wherein the output clock or a version of the output clock is received by a clock generator as a reference clock.

Example 14

The apparatus of example 13, wherein the processor die comprises a finite state machine to analyze the comparison of the frequencies of the first, second, and third clocks with one another, to determine an unauthorized change in the first, second, or third clock frequencies.

Example 15

The apparatus of example 14, wherein the FSM is to instruct an operating system (OS) or a power management circuitry to turn off a processor when the unauthorized change is determined.

Example 16

A system-on-chip (SOC) in a package, wherein the SOC comprising: a memory; a processor coupled to the memory; and interposer coupled to the processor, wherein the interposer comprises: a first oscillator to generate a first clock; a second oscillator to generate a second clock; and a third oscillator to generate a third clock; and wherein the processor includes: a first counter to count frequency of the first clock with respect to a fourth clock; a second counter to count frequency of the second clock with respect to the fourth clock; a third counter to count frequency of the third clock with respect to the fourth clock; and a circuitry to compare frequencies of the first, second, and third clocks with one another.

Example 17

The SOC of example 16, wherein the processor is stacked over the interposer.

Example 18

The SOC of example 16, wherein the processor is over the interposer and laterally offset from the processor.

Example 19

The SOC of example 16, wherein the interposer comprises a fourth oscillator to generate the fourth clock, wherein frequency of the fourth clock is higher than individual frequencies of the first, second, and third clocks.

Example 20

The SOC of example 19, wherein the first, second, third, or fourth oscillators include one of: LC oscillator; MEMS based resonator; or ring oscillator.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a substrate;
a resonator die embedded in the substrate, the resonator die comprising first, second, third and fourth oscillators to generate first, second, third and fourth clocks, respectively, and the fourth clock has a frequency higher than frequencies of the first, second, and third clocks;
a platform controller hub die on the substrate;
traces in the substrate to carry the first, second, third and fourth clocks from the resonator die to the platform controller hub die;
a processor die on the substrate, the processor die comprising a processor;
a trace in the substrate to couple the platform controller hub die with the processor die, wherein the platform controller hub die comprises first, second and third counters to obtain counts of the frequencies of the first, second, and third clocks with respect to the fourth clock, a state machine to select a clock among the first, second and third clocks as a reference clock for the processor based on the counts of the frequencies of the first, second, and third clocks, and a multiplexer, and the multiplexer, in response to a select signal from the state machine, is to output the selected clock as the reference clock on the trace in the substrate which couples the platform controller hub die with the processor die; and
a comparator on the platform controller hub die to compare the counts from the first and second counters to generate a first comparison result as an output, to compare the counts from the first and third counters to generate a second comparison result as an output, and to compare the counts from the second and third counters to generate a third comparison result as an output, wherein the state machine is to identify, and flag as a compromised clock, one of the clocks for which a count of frequency is not within a threshold count of frequency of others of the clocks.

2. The apparatus of claim 1, wherein the substrate is an interposer between a circuit board and the platform controller hub die.

3. The apparatus of claim 1, wherein the first, second and third oscillators include one of:
an LC oscillator;
a MEMS based resonator; or
a ring oscillator.

4. The apparatus of claim 1, wherein the state machine is to compare the counts of the first, second, and third comparison results with one another, to determine an unauthorized change in the first, second, or third clock frequencies.

5. The apparatus of claim 4, wherein the state machine is to instruct an operating system (OS) or a power management circuitry to turn off a processor when the unauthorized change is determined.

6. The apparatus of claim 1, wherein the reference clock is for a phase-locked loop of the processor.

7. The apparatus of claim 1, wherein the reference clock is for a phase-locked loop of the processor, and the phase-locked loop of the processor is to generate one or more clocks for operating the processor.

8. The apparatus of claim 1, wherein the processor is to shut down if any of the first, second and third clocks has a change in frequency beyond a threshold.

9. The apparatus of claim 1, wherein the first, second and third clocks are spatially distributed on the resonator die.

10. The apparatus of claim 1, wherein:
the platform controller hub die comprises a first AND gate to compare the counts from the first and second counters to generate a first comparison result as an output, a second AND gate to compare the counts from the first and third counters to generate a second comparison result as an output, and a third AND gate to compare counts from the second and third counters to generate a third comparison result as an output; and
the state machine is to select the clock among the first, second and third clocks as the reference clock in response to the first, second and third comparison results.

11. An apparatus, comprising:
a substrate;
a resonator die embedded in the substrate, the resonator die comprising first, second, third and fourth oscillators to generate first, second, third and fourth clocks, respectively, and the fourth clock has a frequency higher than frequencies of the first, second, and third clocks;
a processor die on the substrate, the processor die comprising a processor;
traces in the substrate to carry the first, second, third and fourth clocks from the resonator die to the processor die, wherein the processor die comprises first, second and third counters to obtain counts of the frequencies of the first, second, and third clocks with respect to the fourth clock, a state machine to select a clock among the first, second and third clocks as a reference clock for the processor based on the counts of the frequencies of the first, second, and third clocks, and a multiplexer, wherein the multiplexer, in response to a select signal from the state machine, is to output the selected clock as the reference clock on a trace in the substrate which couples the resonator die with the processor die; and
a comparator on the processor die to compare the counts from the first and second counters to generate a first comparison result as an output, to compare the counts from the first and third counters to generate a second comparison result as an output, and to compare the counts from the second and third counters to generate a third comparison result as an output, wherein the state machine is to identify, and flag as a compromised clock, one of the clocks for which a count of frequency is not within a threshold count of frequency of others of the clocks.

12. The apparatus of claim 11, wherein:
the processor die has an active side facing the substrate; and
the active side comprises one or more electrical routing features.

* * * * *